(12) United States Patent
Han et al.

(10) Patent No.: US 7,462,876 B2
(45) Date of Patent: Dec. 9, 2008

(54) NITRIDE SEMICONDUCTOR LIGHT EMITTING DEVICE

(75) Inventors: Sang Heon Han, Kyungki-do (KR); Bang Won Oh, Kyungki-do (KR); Je Won Kim, Kyungki-do (KR); Hyun Wook Shim, Kyungki-do (KR); Joong Seo Kang, Kyungki-do (KR); Dong Ju Lee, Kwangjoo (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 130 days.

(21) Appl. No.: 11/584,503

(22) Filed: Oct. 23, 2006

(65) Prior Publication Data

US 2007/0145406 A1 Jun. 28, 2007

(30) Foreign Application Priority Data

Dec. 28, 2005 (KR) .................. 10-2005-0132248

(51) Int. Cl.
*H01L 33/00* (2006.01)

(52) U.S. Cl. .................. 257/96; 257/97; 257/101; 257/103; 257/E33.034

(58) Field of Classification Search .................. 257/96, 257/97, 101, 103, E33.034
See application file for complete search history.

(56) References Cited

U.S. PATENT DOCUMENTS

| 6,515,308 B1* | 2/2003 | Kneissl et al. ............... 257/86 |
| 2003/0047744 A1* | 3/2003 | Yanamoto .................... 257/98 |
| 2004/0051107 A1* | 3/2004 | Nagahama et al. ........... 257/79 |

* cited by examiner

*Primary Examiner*—Minh-Loan T Tran
(74) *Attorney, Agent, or Firm*—McDermott Will & Emery LLP

(57) ABSTRACT

Disclosed herein is a nitride semiconductor light emitting device, which is improved in luminance and reliability. The light emitting device, comprises an n-type nitride semiconductor layer, an active layer and a p-type nitride semiconductor layer sequentially formed on a substrate, an n-side electrode formed on a portion of an upper surface of the n-type nitride semiconductor layer, and at least one intermediate layer formed between the substrate and the n-type nitride semiconductor layer. The intermediate layer has a multilayer structure of three or more layers having different band-gaps, and is positioned below the n-side electrode.

19 Claims, 6 Drawing Sheets

NITRIDE SEMICONDUCTOR LIGHT EMITTING DEVICE

RELATED APPLICATION

The present invention is based on, and claims priority from, Korean Application Number 2005-132248, filed on Dec. 28, 2005, the disclosure of which is incorporated by reference herein in its entirety.

BACKGROUND OF THE INVENTION

1. Field of the Invention

The present invention generally relates to a nitride semiconductor light emitting device, and, more particularly, to a nitride semiconductor light emitting device, which is reduced in crystal defects, and has improved luminance and reliability.

2. Description of the Related Art

Recently, a group III-V nitride semiconductor, such as a GaN semiconductor, has been in the spotlight as an essential material for light emitting devices, such as light emitting diodes (LEDs), laser diodes (LDs), and the like, due to its excellent physical and chemical properties. The III-V nitride semiconductor material comprises a GaN-based material having the formula $In_xAl_yGa_{(1-x-y)}N$ (where $0 \leq x \leq 1$, $0 \leq y \leq 1$, $0 \leq x+y \leq 1$). In particular, LEDs or LDs of the nitride semiconductor material are mainly used for light emitting devices for emitting light in the blue or green wavelength band, and are used as a light source for many applications, such as video display boards, illuminating apparatuses, etc.

With an increasing demand of nitride semiconductor light emitting devices, the nitride semiconductor light emitting devices are required to have further improved luminance and reliability. However, the nitride semiconductor such as the GaN semiconductor is generally grown on a heterogeneous substrate such as a sapphire substrate, and thus suffers from crystal defects due to lattice mismatch between the semiconductor material and the heterogeneous substrate. The crystal defects provide an adverse influence on reliability (for example, tolerance to electrostatic discharge ESD) of the light emitting device, and deteriorate the luminance of the light emitting device via absorption of light. Although various attempts including a selective epitaxial growth method have been progressed to prevent the crystal defects, these attempts have problems of a complicated process such as deposition of $SiO_2$ mask, and high manufacturing costs.

Figure 1:
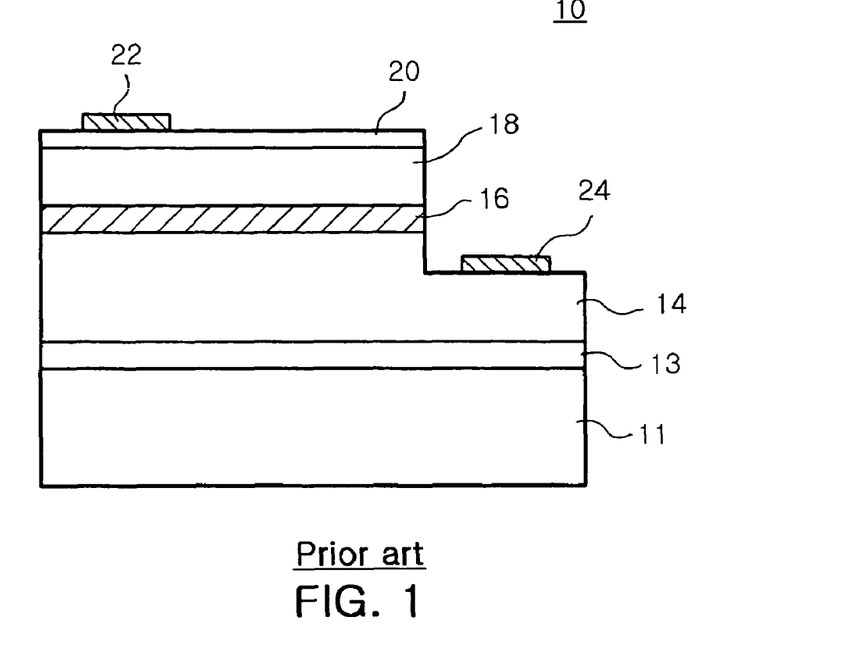
FIG. 1 is a cross-sectional view of a conventional nitride semiconductor light emitting device.

FIG. 1 is a cross-sectional view of a conventional nitride semiconductor light emitting device, particularly, showing a nitride semiconductor light emitting diode (LED). Referring to FIG. 1, the nitride semiconductor LED 10 comprises a buffer layer 13, an n-type GaN clad layer 14, an active layer 16, and a p-type GaN clad layer 18 sequentially stacked on a sapphire substrate 11. Some portions of the n-type GaN clad layer 14 and the p-type GaN clad layer 18 are exposed by mesa etching so as to allow an n-side electrode 24 to be formed on the exposed portion of the n-type GaN clad layer 14. A transparent electrode layer 20 formed from ITO and the like is formed along with a p-side electrode 22 on the p-type GaN clad layer 18. The buffer layer serves to relieve the lattice mismatch between the sapphire substrate and the GaN clad layer 14, and can be formed from AlN or GaN at low temperatures. Japanese Patent Laid-open Publication No. (Hei) 10-135514 discloses a nitride semiconductor light emitting device comprising an active layer having the multi quantum-well structure which comprises an undoped GaN barrier layer and an undoped InGaN well layer in order to improve efficiency of light emission.

Even with the buffer layer 13, however, the problems caused by the crystal defects within the light emitting device 10 cannot be satisfactorily solved. A significant density of crystal defects remains in the nitride semiconductor crystal, in particular, in the active layer. The crystal defects not only obstruct light emission from the active layer through absorption of light, but also reduce a reverse breakdown voltage or a tolerance voltage to reverse ESD. In this manner, the crystal defects deteriorate the luminance and reliability of the light emitting device.

SUMMARY OF THE INVENTION

The present invention has been made in view of the above problems, and it is an object of the present invention to provide a high quality nitride semiconductor light emitting device, which has a low density of crystal defects in a nitride semiconductor crystal, particularly, in an active layer.

It is another object of the present invention to provide the nitride semiconductor light emitting device which exhibits high luminance and excellent reliability.

In accordance with one aspect of the present invention, the above and other objects can be accomplished by the provision of a nitride semiconductor light emitting device, comprising: an n-type nitride semiconductor layer, an active layer and a p-type nitride semiconductor layer sequentially formed on a substrate; an n-side electrode formed on a portion of an upper surface of the n-type nitride semiconductor layer; and at least one intermediate layer formed between the substrate and the n-type nitride semiconductor layer below the n-side electrode, the intermediate layer having a multilayer structure of three or more layers having different band-gaps.

The intermediate layer may comprise a semiconductor material having the formula $In_xAl_yGa_{(1-x-y)}N$ (where $0 \leq x \leq 1$, $0 \leq y \leq 1$, $0 \leq x+y \leq 1$), and the multilayer structure of the intermediate layer may have different energy bands with different composition ratios of Al and In.

Each of the layers constituting the intermediate layer may have a thickness in the range of 10~300 Å. Preferably, the intermediate layer has a super lattice structure.

According to one embodiment of the present invention, the intermediate layer may comprise a laminate of AlGaN/GaN/InGaN layers. Alternatively, the intermediate layer may have the multilayer structure in which laminates of AlGaN/GaN/InGaN layers are repetitiously stacked.

According to another embodiment of the present invention, the intermediate layer may comprise a laminate of InGaN/GaN/AlGaN layers. Alternatively, the intermediate layer may have the multilayer structure in which laminates of InGaN/GaN/AlGaN layers are repetitiously stacked.

According to yet another embodiment of the present invention, the intermediate layer may have the multilayer structure in which laminates of AlGaN/GaN/InGaN/GaN layers are repetitiously stacked, the AlGaN/GaN/InGaN/GaN layers constituting one stacking cycle in the multilayer structure. The GaN layer interposed between the AlGaN layer and the InGaN layer serves to relieve stress from the AlGaN and InGaN layers, thereby more effectively prevent formation of the crystal defects.

At least a portion of the intermediate layer may be doped with n-type impurities such as Si and the like, or with p-type impurities such as Mg and the like. Alternatively, the intermediate layer may be an undoped layer. Alternatively, In may be added as impurities to at least a portion of the intermediate layer. In this manner, the In impurities act as surfactants, and serve to pin dislocations.

According to yet another embodiment of the present invention, the intermediate layer may have the multilayer structure comprising four or more layers of different band-gaps stacked therein. In this case, among the layers constituting the intermediate layer, one or more layers are stacked between a first layer having the highest band-gap and a second layer having the lowest band-gap such that band-gaps of the layers sequentially increase or decrease in a stacking direction between the first layer and the second layers.

According to the present invention, the substrate may be formed of a material selected from the group consisting of sapphire, SiC, Si, ZnO, MgO and GaN. Preferably, the nitride semiconductor light emitting device further comprises an undoped GaN layer between the substrate and the intermediate layer. The nitride semiconductor light emitting device may further comprise a buffer layer between the substrate and the undoped GaN layer. The nitride semiconductor light emitting device may further comprise a current spreading layer between the n-type nitride semiconductor layer and the active layer.

In accordance with another aspect of the present invention, a nitride semiconductor light emitting device is provided, comprising: a first n-type nitride semiconductor layer, an intermediate layer, a second n-type nitride semiconductor layer, an active layer and a p-type nitride semiconductor layer sequentially formed on a substrate; and an n-side electrode formed on a portion of an upper surface of the second n-type nitride semiconductor layer, wherein the intermediate layer has a multilayer structure formed by stacking three or more layers having different band-gaps, and is positioned below the n-side electrode. The intermediate layer may have a super lattice structure in which laminates of InGaN/GaN/AlGaN layers are repetitiously stacked. Alternatively, the intermediate layer may have a super lattice structure in which laminates of AlGaN/GaN/InGaN layers are repetitiously stacked.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings. It should be noted that the embodiments of the invention can take various forms, and that the present invention is not limited to the embodiments described herein. The embodiments of the invention are described so as to enable those having an ordinary knowledge in the art to have a perfect understanding of the invention. Accordingly, shape and size of components of the invention are enlarged in the drawings for clear description of the invention. Like components are denoted by the same reference numerals throughout the drawings.

Figure 2:
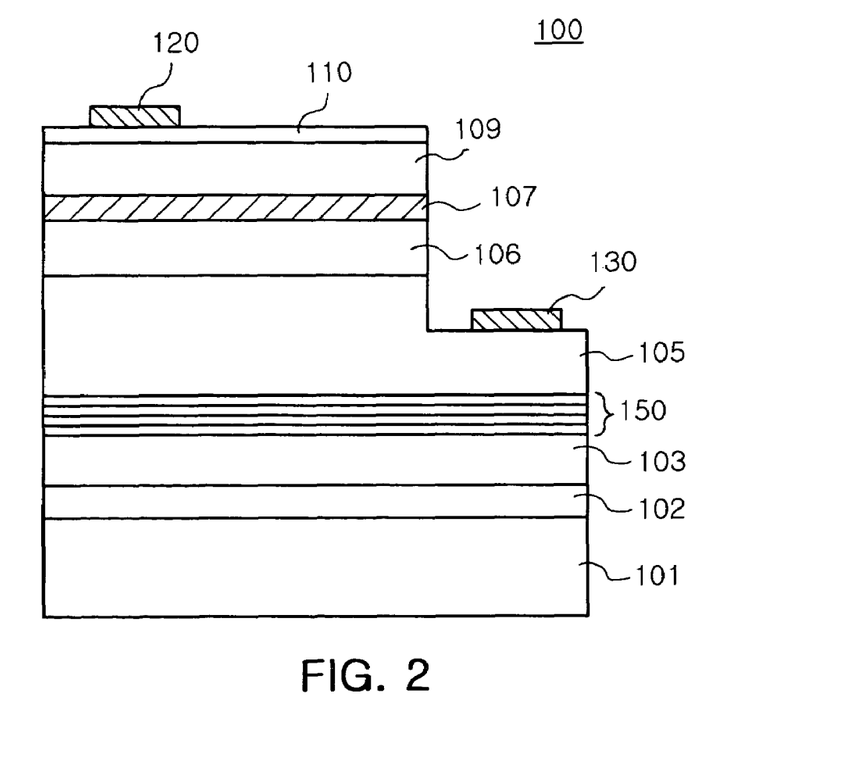
FIG. 2 is a cross-sectional view of a nitride semiconductor light emitting device according to one aspect of the present invention.

FIG. 2 is a cross-sectional view illustrating a nitride semiconductor light emitting device according to one aspect of the invention. In particular, FIG. 2 shows a nitride semiconductor light emitting diode (LED). Referring to FIG. 2, the nitride semiconductor light emitting device 100 comprises an undoped GaN layer 102, a first n-type nitride semiconductor layer 103, a multilayered intermediate layer 150, a second n-type nitride semiconductor layer 105, a current spreading layer 106, an active layer 107, and a p-type nitride semiconductor layer 109 sequentially stacked on a sapphire substrate. Both first and second first n-type nitride semiconductor layers 103 and 105 may be, for example, n-doped GaN layers. The p-type nitride semiconductor layer 109 may be, for example, a p-doped GaN layer and/or a p-doped AlGaN layer. The active layer 107 may have a multi-quantum well structure of, for example, InGaN/GaN. The current spreading layer 106 serves to activate current spreading in a lateral direction, and may have, for example, a multilayer structure which comprises layers having different doping concentrations.

Figure 3:
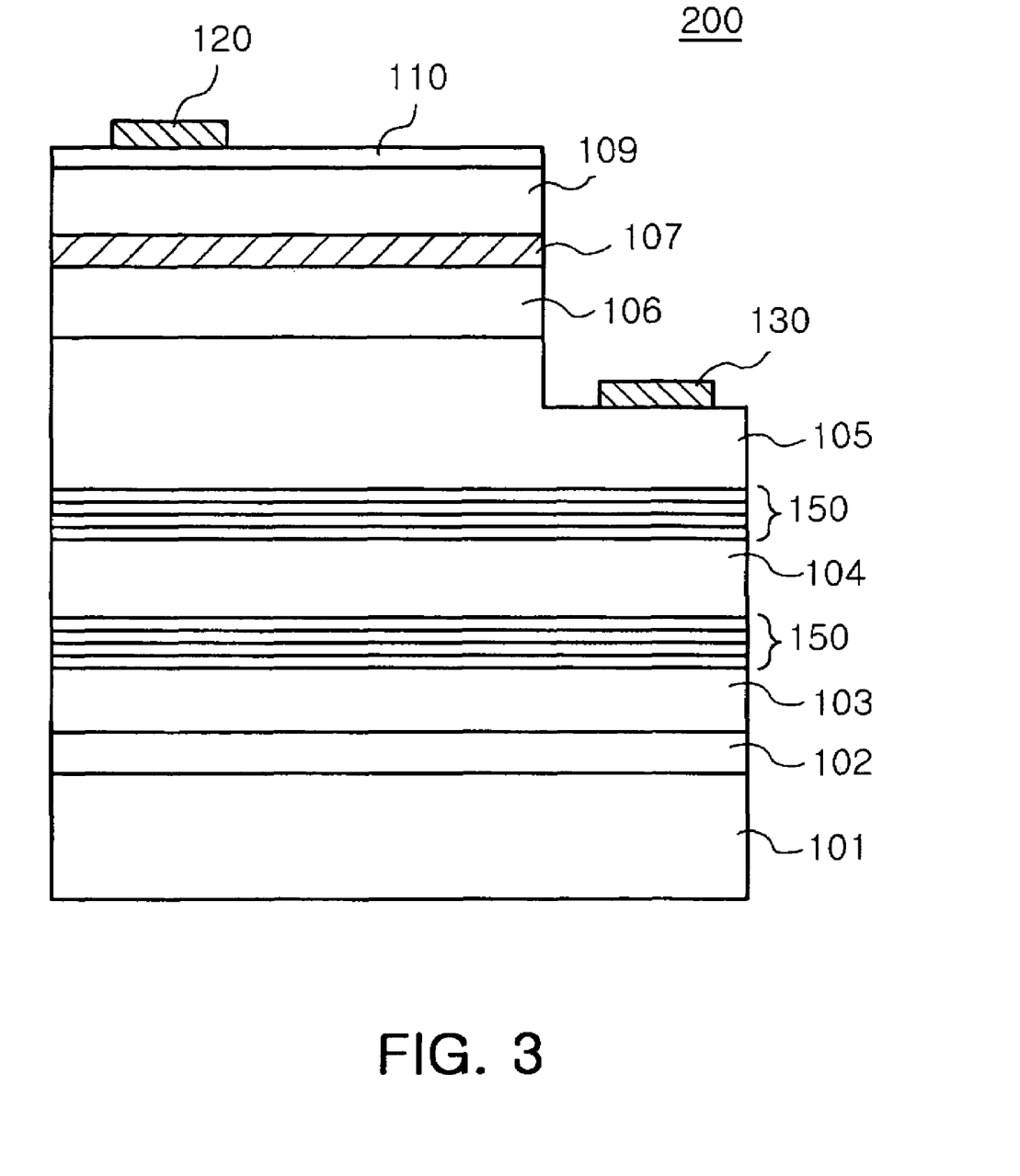
FIG. 3 is a cross-sectional view of a nitride semiconductor light emitting device according to another aspect of the present invention.

A transparent electrode layer 110 of ITO and the like and a p-side electrode 120 may be sequentially stacked on the p-type nitride semiconductor layer 109, and an n-side electrode 130 may be formed on a portion of an upper surface of the second n-type nitride semiconductor layer 105, which is exposed by mesa etching. As shown in FIGS. 2 and 3, a buffer layer 113 such as a low temperature AlN layer may be formed between the sapphire substrate 101 and the undoped GaN layer 102.

The intermediate layer 150 is positioned below the n-side electrode 130 (particularly, under the second nitride semiconductor layer 105), and has a multilayer structure, which is formed by stacking three or more layers having different band-gaps. With the three or more layers of the different band-gaps, the intermediate layer 150 effectively bends and stops propagation of dislocations. In other words, when three or more band-gaps are consecutively stacked on the energy band diagram of the intermediate layer 150, the dislocations generated below the intermediate layer 150 are effectively suppressed from propagating above the intermediate layer 150. In this manner, the intermediate layer 150 serves to shield the crystal defects generated in the first n-type nitride semiconductor layer 103. As a result, the second n-type nitride semiconductor layer 105 and the active layer 107 are reduced in amount of the crystal defects, and exhibit a better crystal quality.

The intermediate layer 150 comprises a nitride semiconductor material which has the formula, $In_xAl_yGa_{(1-x-y)}N$ (where $0 \leq x \leq 1$, $0 \leq y \leq 1$, $0 \leq x+y \leq 1$). Nitride semiconductor layers of the intermediate layer 150 have different composition ratios of Al and In to form the multilayer structure with the modified band-gaps. For example, the intermediate layer may comprise a laminate of AlGaN/GaN/InGaN layers or a laminate of InGaN/GaN/AlGaN layers (see FIGS. 4 to 9). Increase in content of Al causes increase of the band-gap, whereas decrease in content of In causes decrease of the band-gap.

Preferably, each of the layers constituting the intermediate layer 150 has a thickness of 10 to 300 Å. The intermediate layer 150 may have a super lattice structure by periodically stacking the thin layers, each of which has such with the modified band-gaps has the super lattice structure, the effect of shielding the crystal defects is further improved.

As described above, the multilayered intermediate layer 150 having the modified band-gaps is formed between the first and the second n-type nitride semiconductor layers 103 and 105 below the n-side electrode 130. Hence, the intermediate layer 150 effectively shields proceeding or propagation of the dislocations towards the active layer 107. In addition, the intermediate layer 150 is positioned below the n-side electrode 130, so that a great amount of crystal defects existing under the intermediate layer 150 does not affect a current path of the light emitting device 100. This is because the current flows into the n-side electrode 130 from the p-type semiconductor layer 109 via the active layer 107 and the second nitride semiconductor layer 105. In consequence, the intermediate layer 150 disposed below the n-side electrode 130 improves the crystal quality of the semiconductor layers 105, 106, 107 and 109, which are positioned in the current path, thereby enhancing the luminance and reliability of the light emitting device 100.

At least a portion of the intermediate layer 150 may be doped with n-type impurities such as Si and the like or with p-type impurities such as Mg and the like. Alternatively, the intermediate layer 150 may be undoped layer. Alternatively, In may be added as impurities to at least a portion of the intermediate layer 150. When In is added as the impurities to the intermediate layer 150, it does not exist as one composition in the intermediate layer 150, unlike In of the InGaN material. As such, the In impurities act as surfactants within the nitride semiconductor layer. Accordingly, the In impurities lower the activation energy of the n-type impurities such as Si and the like or the p-type impurities such as Mg and the like, thereby increasing a ratio of Si or Mg which actually generates carriers (electrons or holes). Furthermore, the In impurities serve to pin the dislocations. As such, due to In added as the impurities into the intermediate layer 150, the density of crystal defects can be further reduced in the layers grown on the intermediate layer 150.

In this aspect of the present invention, the sapphire ($Al_2O_3$) substrate is used as the substrate 101 for crystal growth of the nitride semiconductor. Alternatively, the substrate may be formed from any kind of material including SiC, Si, ZnO, MgO, GaN, etc., which permits the crystal growth of the nitride semiconductor layers.

Although the light emitting device 100 is described as comprising the single intermediate layer 150 in the above aspect of the invention, the light emitting device may comprise two or more intermediate layers. One example of this structure is shown in FIG. 3. FIG. 3 is a cross-sectional view of a nitride semiconductor light emitting device 200 according to another aspect of the invention. In FIG. 3, two intermediate layers 150 are formed between an n-side electrode 130 and a substrate 101. The two intermediate layers 150 have another n-type nitride layer 104 disposed therebetween. In this manner, with the two or more intermediate layers 150, the dislocations can be further suppressed from propagating towards the active layer 107. Other components of the light emitting device 200 are the same as those of the light emitting device 100 of FIG. 2.

Next, there will be described the multilayer structure and band-gap structure of the intermediate layer 150 according to various embodiments with reference to FIGS. 4 to 10.

Embodiment 1

Figure 4:
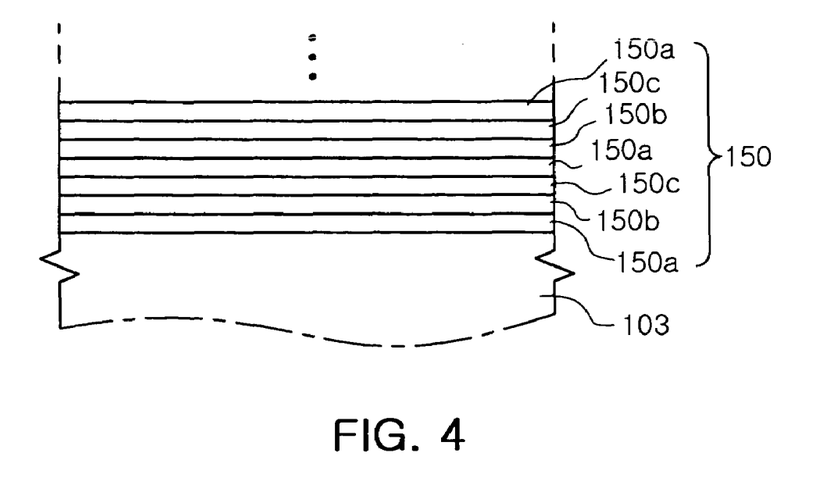
FIG. 4 is a partially cross-sectional view of a multilayered intermediate layer according to a first embodiment of the present invention.
Figure 5:
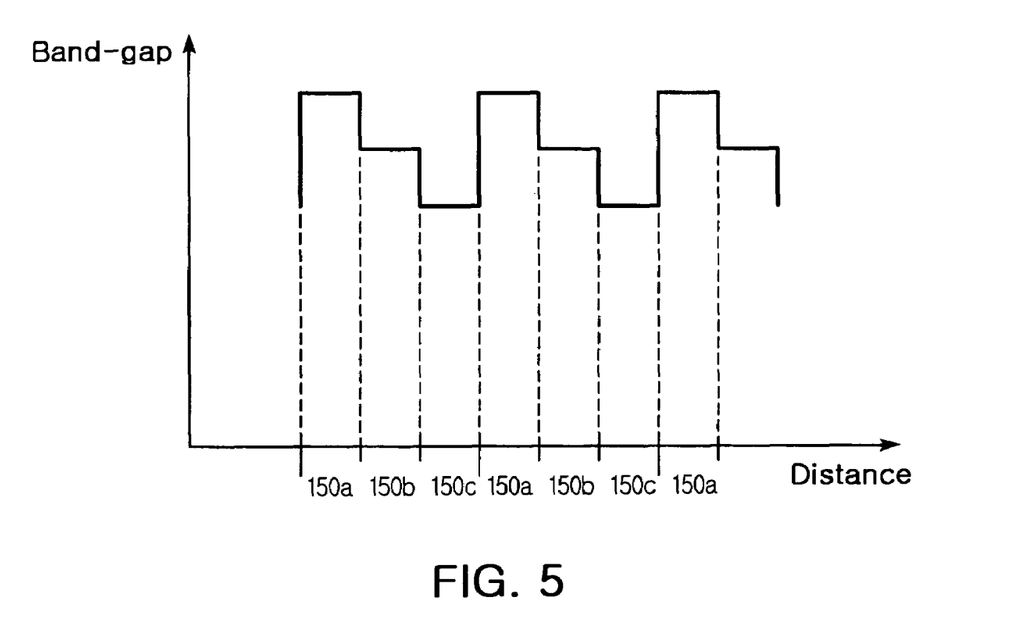
FIG. 5 is a graph depicting one example of a band-gap profile of the multilayered intermediate layer of FIG. 4.

FIG. 4 is a partially cross-sectional view of a multilayered intermediate layer according to a first embodiment of the invention, and FIG. 5 is a graph depicting one example of a band-gap profile of the multilayered intermediate layer of FIG. 4.

Referring to FIGS. 4 and 5, the multilayered intermediate layer 150 comprises a laminate of an AlGaN layer 150a, a GaN layer 150b and an InGaN layer 150c, which are sequentially stacked therein. In particular, laminates of the AlGaN layer 150a, GaN layer 150b and InGaN layer 150c are repetitiously stacked in the intermediate layer 150. In this embodiment, the AlGaN/GaN/InGaN layers 150a, 150b and 150c constitute one stacking cycle in the multilayer structure. Preferably, the intermediate layer 150 has the super lattice structure. Among the nitride semiconductor layers 150a, 150b and 150c constituting the intermediate layer 150, the AlGaN layer 150a has the highest band-gap, and the InGaN layer 150c has the lowest band-gap. The GaN layer 150b interposed between the AlGaN layer 150a and the InGaN layer 150c has a band-gap lower than that of the AlGaN layer 150a and higher than that of the InGaN layer 150c.

The multilayer structure of the three layers (AlGaN/GaN/InGaN) with different band-gaps serves to effectively shield the dislocations. In particular, the InGaN layer 150c effectively bends and stops propagation of the dislocations upon growth of the AlGaN layer 150a and the InGaN layer 150b. In addition, the GaN layer 150b serves to relieve tensile stress from the AlGaN layer 150a of the highest band-gap and compressive stress from the InGaN layer 150b of the lowest band-gap. As such, the intermediate layer 150 shields the dislocations while relieving the stress.

In order to further improve the effect of shielding the dislocations, In may be added as impurities (rather than one composition) to at least a portion of the intermediate layer (for example, to the AlGaN layer 150a or the InGaN layer 150c). The In impurities added into the intermediate layer 150 can act as surfactants, and pin the dislocations, thereby further decreasing the density of dislocations in the second n-type semiconductor layer 105, current spreading layer 106, active layer 107, and p-type nitride semiconductor layer 109 on the intermediate layer 150.

With the multilayered intermediate layer according to the first embodiment, the density of crystal defects is decreased in the n-type semiconductor layer 105, active layer 107 and p-type nitride semiconductor layer 109, which constitute a current path. As a result, a non-radioactive recombination rate decreases, but a radioactive recombination rate increases in the active layer 107. Hence, the luminance of the light emitting device 100 increases. In addition, since the crystal quality of the semiconductor layers constituting the current path is improved, the device has a low operating voltage and improved reliability (for example, reverse breakdown voltage or tolerance to ESD).

Embodiment 2

Figure 6:
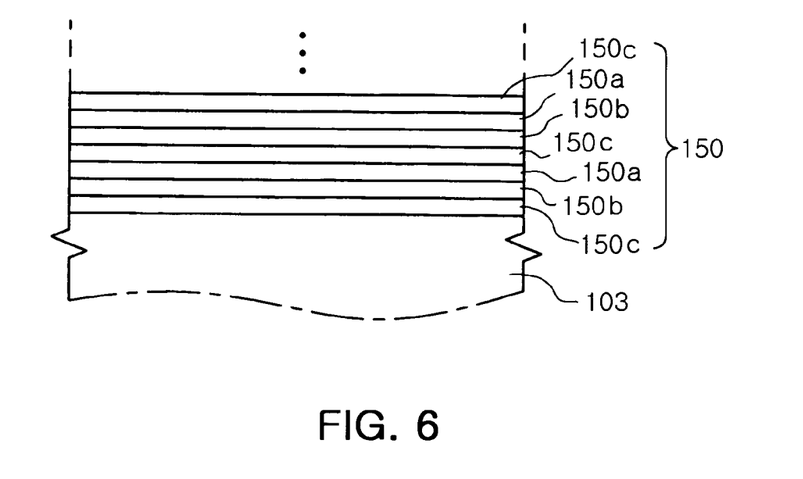
FIG. 6 is a partially cross-sectional view of a multilayered intermediate layer according to a second embodiment of the present invention.
Figure 7:
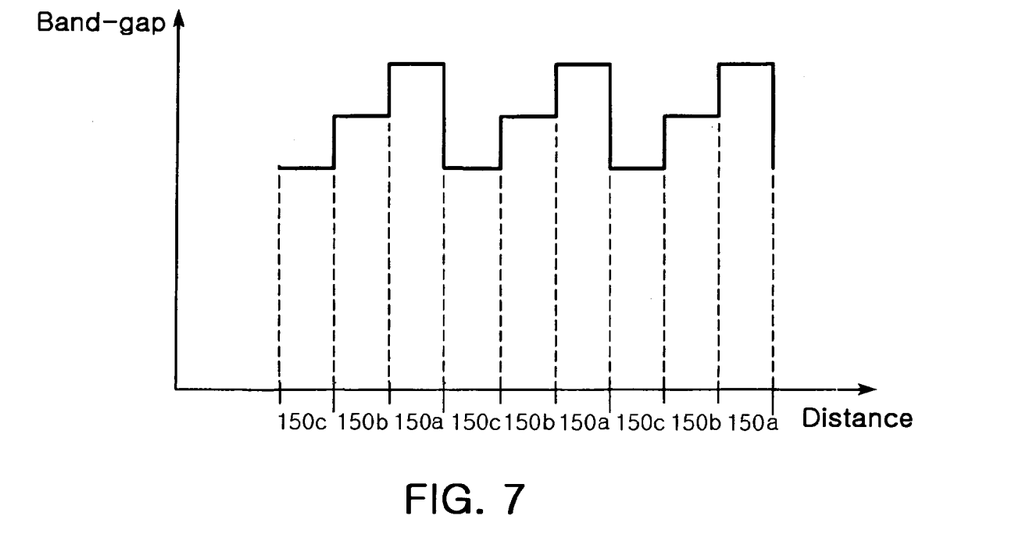
FIG. 7 is a graph depicting one example of a band-gap profile of the multilayered intermediate layer of FIG. 6.

FIG. 6 is a partially cross-sectional view of a multilayered intermediate layer according to a second embodiment of the invention, and FIG. 7 is a graph depicting one example of a band-gap profile of the multilayered intermediate layer of FIG. 6. In terms of sequence of stacking layers for the intermediate layer, the intermediate layer of the second embodiment is different from that of the first embodiment.

Referring to FIGS. 6 and 7, laminates of an InGaN layer 150c, a GaN layer 150b and an AlGaN layer 150a are repetitiously stacked on a first nitride semiconductor layer 103. In this embodiment, the InGaN/GaN/AlGaN layers 150c, 150b and 150a constitute one stacking cycle in the multilayer structure. Preferably, the intermediate layer 150 has the super lattice structure. As shown in FIG. 7, the nitride semiconductor layers of the intermediate layer 150 are repetitiously stacked in the sequence of InGaN/GaN/AlGaN layers 150c, 150b and 150a (opposite to that of the first embodiment shown in FIG. 1).

As in the first embodiment, the multilayer structure of the three layers (InGaN/GaN/AlGaN) with different band-gaps also serves to effectively shield the dislocations. That is, the InGaN layer 150c effectively bends and stops propagation of the dislocations upon growth of the AlGaN layer 150a and the GaN layer 150b. Furthermore, In added as impurities into a portion of the intermediate layer 150 serves to pin the dislocations, thereby further decreasing the density of dislocations in the semiconductor layers 105, 106, 107 and 109 on the intermediate layer 150.

Furthermore, as in the first embodiment, the intermediate layer 150 of the second embodiment shields the dislocations generated therebelow, thereby decreasing the density of dislocations in the semiconductor layers 105, 106, 107 and 109 which provides the current path, and increasing the luminance and reliability of the device.

Embodiment 3

Figure 8:
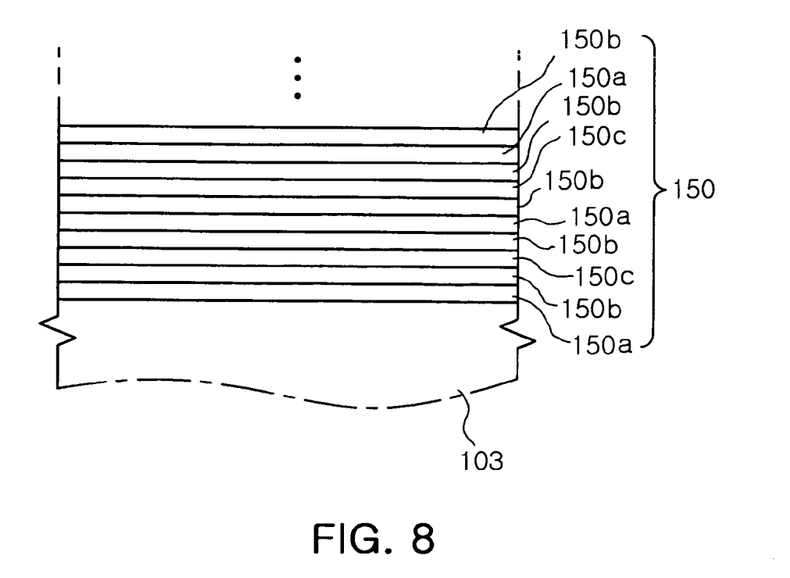
FIG. 8 is a partially cross-sectional view of a multilayered intermediate layer according to a third embodiment of the present invention.
Figure 9:
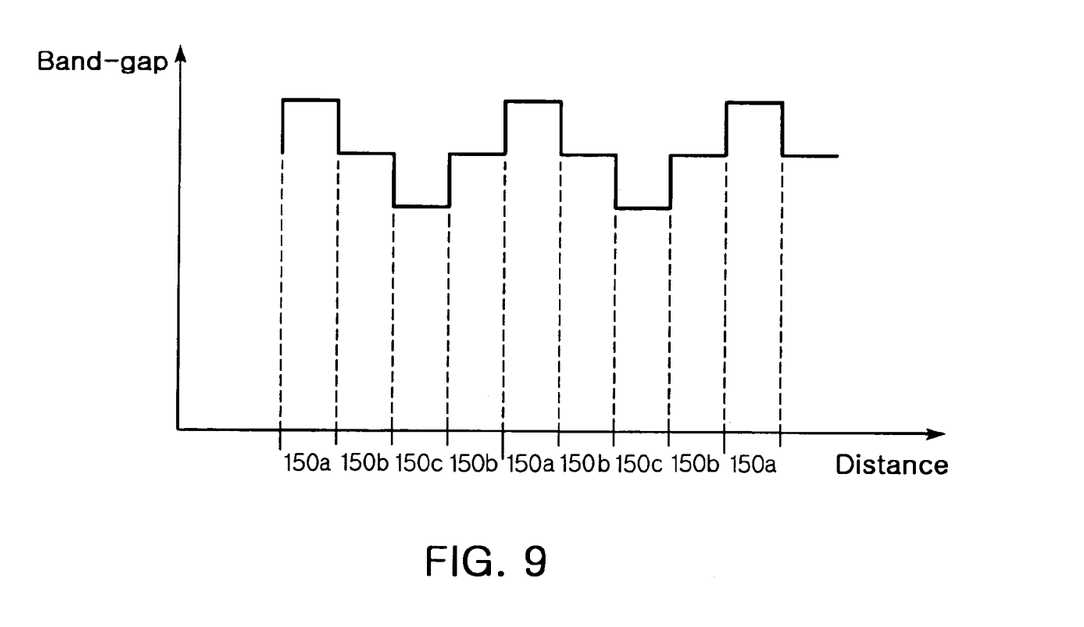
FIG. 9 is a graph depicting one example of a band-gap profile of the multilayered intermediate layer of FIG. 8.

FIG. 8 is a partially cross-sectional view of a multilayered intermediate layer according to a third embodiment of the invention, and FIG. 9 is a graph depicting one example of a band-gap profile of the multilayered intermediate layer of FIG. 8. According to the third embodiment, the intermediate layer comprises a GaN layer interposed between an AlGaN layer and an InGaN layer so as not to form an AlGaN/InGaN interface.

Referring to FIGS. 8 and 9, laminates of AlGaN/GaN/InGaN/GaN layers 150a, 150b, 150c and 150b are repetitiously stacked on a first nitride semiconductor layer 103. In this embodiment, the AlGaN/GaN/InGaN/GaN layers 150a, 150b, 150c and 150b constitute one stacking cycle in the multilayer structure. Preferably, the intermediate layer 150 has the super lattice structure. As shown in FIG. 9, the GaN layer 150b is interposed between the AlGaN layer 150a of a higher band-gap and the InGaN layer 150c of a lower band-gap so as not to form the AlGaN/InGaN interface. As in the above embodiments, the intermediate layer 150 of the third embodiment has the multilayer structure comprising the three or more layers of the different band-gaps serves to shield the crystal defects.

In this manner, with the multilayer structure having the GaN layer 150b interposed between the AlGaN layer 150a and the InGaN layer 150c, the tensile stress of the AlGaN layer 150a and the compressive stress of the InGaN layer 150c can be effectively relieved. As a result, the intermediate layer 150 is further reduced in stress, and has a lower density of crystal defects. The improved stress relieving effect of the intermediate layer 150 provides an additional contribution to improve the crystal quality of the semiconductor layers 105, 106, 107 and 109 on the intermediate layer 150.

Embodiment 4

Figure 10:
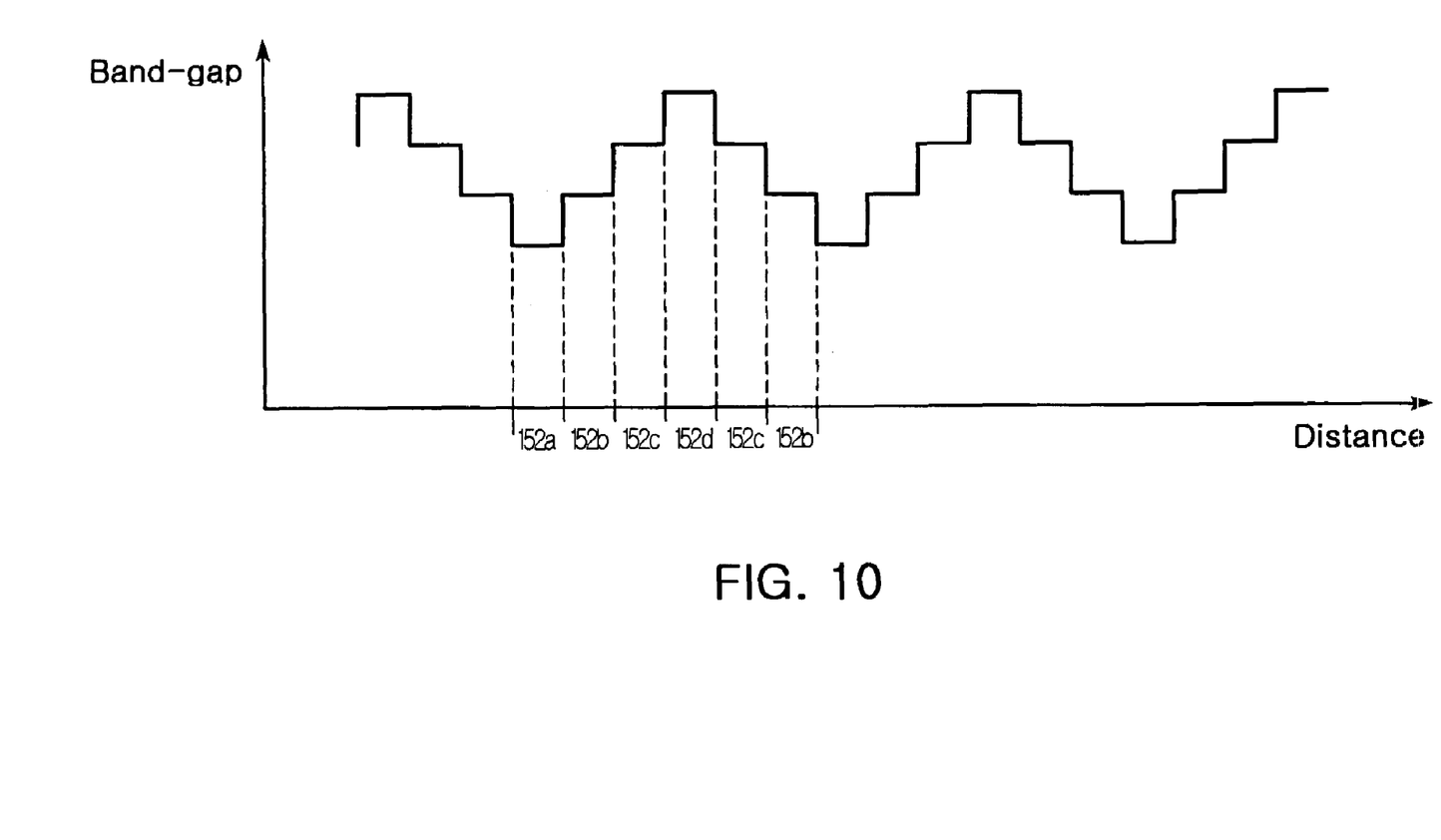
FIG. 10 is a graph depicting one example of a band-gap profile of a multilayered intermediate layer according to a fourth embodiment of the present invention.

FIG. 10 is a graph depicting one example of a band-gap profile of a multilayered intermediate layer according to a forth embodiment of the present invention. According to this embodiment, the intermediate layer comprises four or more layers 152a, 152b, 152c and 152d which have different band-gaps (for convenience, a partially cross-sectional view of the intermediate layer is omitted).

Referring to FIG. 10 in the intermediate layer of the forth embodiment, four layers 152a, 152b, 152c and 152d have the different band-gaps from the lowest band-gap of the layer 152a ($In_xAl_yGa_{(1-x-y)}N$ layer which has the lowest content of Al and the highest content of In) to the highest band-gap of the layer 152d ($In_mAl_nGa_{(1-m-n)}N$ layer which has the highest content of Al and the lowest content of In). The four layers 152a, 152b, 152c and 152d are repetitiously stacked once or more, and preferably constitute the super lattice structure. As apparent from the above description, with the multilayer structure of the three or more layers of the modified band-gaps, the intermediate layer can effectively shield propagation of the dislocations. The band-gap of each layer can be controlled by adjusting a composition ratio of Al and In of each layer 152a, 152b, 152c or 152d.

Particularly, in this embodiment, other layers 152b and 152c are stacked between the highest band-gap layer 152d and the lowest band-gap layer 152a such that band-gaps of the layers sequentially increase or decrease in a stacking direction. With the multilayer structure of the intermediate layer in which the band-gaps sequentially increase or decrease in the stacking direction, the stress caused by the difference in band-gaps can be effectively relieved. In other words, the layers 152b and 152c between the lowest band-gap layer 152a and the highest band gap layer 152d have the sequentially increasing or decreasing band-gaps, and serve to effectively relieve the stress.

In order to confirm improved effects in view of luminance and electric characteristics, inventors of the present invention performed experiments to evaluate the luminance and the electric characteristics for a GaN LED device having an intermediate layer and for a conventional GaN LED device without the intermediate layer. In this experiment, the intermediate layer of the LED has a multilayer structure in which laminates of AlGaN/GaN/InGaN layers are repeated. With results of the experiments, it can be found that the LED device having the intermediate layer is improved in reverse breakdown voltage Vr by about 30% in comparison to the conventional LED device without the intermediate layer. In addition, the LED device having the intermediate layer is improved in optical power Po by about 25% in comparison to the conventional LED device without the intermediate layer.

The improvement in the optical power Po through the intermediate layer means improvement in luminance of the device, which is caused by reduction in amount of the crystal defects and by current spreading in the semiconductor crystal. In addition, the improvement in reverse breakdown voltage means improvement in reliability of the device, which is caused by reduction in amount of the crystal defects in the semiconductor crystal. As such, according to the present invention, the quality of the crystal is improved by insertion of the intermediate layer, thereby enhancing the luminance and the reliability of the device.

As apparent from the above description, according to the present invention, a multilayered intermediate layer having three or more layers of different band-gaps is disposed between a substrate and an n-type semiconductor layer below an n-side electrode, reducing the density of crystal defects in semiconductor layers which provides a current path. As a result, the luminance and the reliability of the light emitting device are significantly improved.

It should be understood that the embodiments and the accompanying drawings have been described for illustrative purposes and the present invention is limited only by the following claims. Further, those skilled in the art will appreciate that various modifications, additions, and substitutions are allowed without departing from the scope and spirit of the invention as set forth in the accompanying claims.

What is claimed is:

1. A nitride semiconductor light emitting device, comprising:
   an n-type nitride semiconductor layer, an active layer and a p-type nitride semiconductor layer sequentially formed on a substrate;
   an n-side electrode formed on a portion of an upper surface of the n-type nitride semiconductor layer; and
   at least one intermediate layer formed between the substrate and the n-type nitride semiconductor layer below the n-side electrode,
   wherein the intermediate layer having a multilayer structure of three or more layers having different band-gaps and the three or more layer are stacked such that band-gaps of the layers sequentially increase or decrease in a stacking direction.

2. The light emitting device according to claim 1, wherein the intermediate layer comprises a semiconductor material having the formula $In_xAl_yGa_{(1-x-y)}N$ (where $0 \leq x \leq 1$, $0 \leq y \leq 1$, $0 \leq x+y \leq 1$), and the multilayer structure of the intermediate layer has different energy bands with different composition ratios of Al and In.

3. The light emitting device according to claim 1, wherein each of the layers constituting the intermediate layer has a thickness in the range of 10 to 300 Å.

4. The light emitting device according to claim 1, wherein the intermediate layer has a super lattice structure.

5. The light emitting device according to claim 1, wherein the intermediate layer comprises a laminate of AlGaN/GaN/InGaN layers.

6. The light emitting device according to claim 5, wherein the intermediate layer has the multilayer structure in which laminates of AlGaN/GaN/InGaN layers are repetitiously stacked.

7. The light emitting device according to claim 1, wherein the intermediate layer comprises a laminate of InGaN/GaN/AlGaN layers.

8. The light emitting device according to claim 7, wherein the intermediate layer has the multilayer structure in which laminates of InGaN/GaN/AlGaN layers are repetitiously stacked.

9. The light emitting device according to claim 1, wherein at least a portion of the intermediate layer is doped with n-type impurities.

10. The light emitting device according to claim 1, wherein at least a portion of the intermediate layer is doped with p-type impurities.

11. The light emitting device according to claim 1, wherein the intermediate layer is an undoped layer.

12. The light emitting device according to claim 1, wherein In is added as impurities to at least a portion of the intermediate layer.

13. The light emitting device according to claim 1, wherein the intermediate layer has the multilayer structure comprising four or more layers of different band-gaps stacked therein.

14. The light emitting device according to claim 1, wherein the substrate is formed of a material selected from the group consisting of sapphire, SiC, Si, ZnO, MgO and GaN.

15. The light emitting device according to claim 1, further comprising an undoped GaN layer between the substrate and the intermediate layer.

16. The light emitting device according to claim 15, further comprising a buffer layer between the substrate and the undoped GaN layer.

17. The light emitting device according to claim 1, further comprising a current spreading layer between the n-type nitride semiconductor layer and the active layer.

18. A nitride semiconductor light emitting device, comprising:
   an n-type nitride semiconductor layer, an active layer and a p-type nitride semiconductor layer sequentially formed on a substrate;
   an n-side electrode formed on a portion of an upper surface of the n-type nitride semiconductor layer; and
   at least one intermediate layer formed between the substrate and the n-type nitride semiconductor layer below the n-side electrode,
   wherein the intermediate layer has the multilayer structure in which laminates of AlGaN/GaN/InGaN/GaN layers are repetitiously stacked, the AlGaN/GaN/InGaN/GaN layers constituting one stacking cycle in the multilayer structure.

19. A nitride semiconductor light emitting device, comprising:
   an n-type nitride semiconductor layer, an active layer and a p-type nitride semiconductor layer sequentially formed on a substrate;
   an n-side electrode formed on a portion of an upper surface of the n-type nitride semiconductor layer; and
   at least one intermediate layer formed between the substrate and the n-type nitride semiconductor layer below the n-side electrode, the intermediate layer having a multilayer structure of four or more layers having different band-gaps,
   wherein, among the layers constituting the intermediate layer, two or more layers are stacked between a first layer having the highest band-gap and a second layer having the lowest band-gap such that band-gaps of the layers sequentially increase or decrease in a stacking direction between the first layer and the second layers.

* * * * *